US012622261B2

(12) United States Patent
Vega et al.

(10) Patent No.: US 12,622,261 B2
(45) Date of Patent: May 5, 2026

(54) FLEXIBLE TRACKPLAN FOR POWER DELIVERY

(71) Applicant: INTERNATIONAL BUSINESS MACHINES CORPORATION, Armonk, NY (US)

(72) Inventors: Reinaldo Vega, Mahopac, NY (US); Ruilong Xie, Niskayuna, NY (US); Nicholas Anthony Lanzillo, Wynantskill, NY (US); Albert M. Chu, Nashua, NH (US); Lawrence A. Clevenger, Saratoga Springs, NY (US); Brent A. Anderson, Jericho, VT (US); Takashi Ando, Eastchester, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 18/448,933

(22) Filed: Aug. 12, 2023

(65) Prior Publication Data

US 2025/0054863 A1    Feb. 13, 2025

(51) Int. Cl.
H10W 20/41 (2026.01)
H10D 84/85 (2025.01)
H10W 20/42 (2026.01)

(52) U.S. Cl.
CPC ......... H10W 20/435 (2026.01); H10W 20/42 (2026.01); H10D 84/859 (2025.01)

(58) Field of Classification Search
CPC ............ H01L 23/5283; H01L 23/5226; H10D 84/859; H10W 20/435; H10W 20/42

USPC ......................................................... 257/734
See application file for complete search history.

(56) References Cited

U.S. PATENT DOCUMENTS

| | | | |
|---|---|---|---|
| 5,801,448 | A | 9/1998 | Ball |
| 8,212,336 | B2 | 7/2012 | Goebel et al. |
| 8,698,205 | B2 | 4/2014 | Tzeng |
| 10,340,359 | B2 | 7/2019 | Smith |
| 10,374,086 | B2 | 8/2019 | Hu |

(Continued)

FOREIGN PATENT DOCUMENTS

| | | |
|---|---|---|
| CN | 113053751 A | 6/2021 |
| CN | 113745213 A | 12/2021 |
| WO | 2019153724 A1 | 8/2019 |

OTHER PUBLICATIONS

U.S. Appl. No. 63/342,767, Drawings-only_black_and_white_line_drawings,May 17, 2022 (Year: 2022).*

(Continued)

Primary Examiner — Tu-Tu V Ho
(74) Attorney, Agent, or Firm — Yuanmin Cai

(57) ABSTRACT

A semiconductor device architecture includes a substrate and a device region including active components carried by the substrate. A plurality of tracks are on the substrate including conductive lines connecting power and signals to the active components in the device region. A first track includes a plurality of segments of a conductive line. A first segment in the first track delivers power to the device region. A second segment in the first track delivers a signal to the device region. The first segment and the second segment are arranged in the same first track.

18 Claims, 13 Drawing Sheets

(56)  References Cited

U.S. PATENT DOCUMENTS

| | | | |
|---|---|---|---|
| 10,796,061 | B1 | 10/2020 | Schultz |
| 11,271,567 | B1 | 3/2022 | Chen |
| 11,437,379 | B2 | 9/2022 | Song |
| 2017/0148682 | A1 | 5/2017 | Basker et al. |
| 2022/0102346 | A1 | 3/2022 | Lilak et al. |
| 2022/0344228 | A1 | 10/2022 | Ho |
| 2023/0036522 | A1 | 2/2023 | Chen |
| 2023/0092184 | A1 | 3/2023 | Schultz |
| 2023/0113296 | A1 | 4/2023 | Farooq |
| 2024/0422006 | A1* | 12/2024 | Nisnevich .............. G06F 9/461 |

OTHER PUBLICATIONS

U.S. Appl. No. 63/342,767—SPEC_May 17, 2022 (Year: 2022).*

Yin, C., "Fabrication of Raised S/D Gate-All-Around Transistor and Gate Misalignment Analysis", IEEE Electron Device Letters (2003); vol. 24:10, pp. 658-660.

Dixit, A. et al., "Analysis of the Parasitic S/D Resistance in Multiple-Gate FETs", IEEE Transactions on Electron Devices (2005), vol. 52:6, pp. 1132-1140.

Eneman, G. et al., "Gate Influence on the Layout Sensitivity of Si1—xGex S/D and Si1-yCy S/D Transistors Including an Analytical Model", IEEE Transactions on Electron Devices (2008), vol. 55:10, pp. 2703-2711.

* cited by examiner

FLEXIBLE TRACKPLAN FOR POWER DELIVERY

BACKGROUND

Technical Field

The present disclosure generally relates to semiconductor device architecture, and more particularly, to a flexible trackplan for power delivery.

Description of the Related Art

In semiconductor device manufacture, conventional methods use frontside contact schemes during wafer processing. In frontside contact schemes, the overlay margins involved in forming frontside contacts are fairly accurate and easy to align with features on the frontside of the device. Some technologies use more backside formed connections. Forming contacts from the backside presents various benefits as well as new challenges including for example, where to position conductive lines to maximize the footprint of area available while still providing power or signal to different parts of the device region.

Generally speaking, whether laying out an architecture for either frontside delivery or backside delivery, the conductive lines are dedicated for either power delivery or signal delivery. Sometimes the length of a track for a circuit may be wholly occupied by for example, a power rail. The same line cannot be used for both power and signal delivery, otherwise a short circuit occurs. If different lines sharing a track are lined up end to end, the lines generally also share the same functional designation for either power delivery or signal delivery. Delivering power from one rail through a device to signal lines typically involves that one track be wholly devoted to carrying power to multiple adjacent signal lines. Circuit layouts are limited however in the options available to position power rails adjacent to signal lines. Much of the circuit layout area is inefficiently used where signal lines are not adjacent power rails. For example, an entire track may be occupied by a power rail, but only a short section of the power rail may be used to deliver power to the device.

SUMMARY

According to an embodiment of the present disclosure, a semiconductor device architecture includes a substrate and a device region including active components carried by the substrate. A plurality of tracks are on the substrate including conductive lines connecting power and signals to the active components in the device region. A first track includes a plurality of segments of a conductive line. A first segment in the first track delivers power to the device region. A second segment in the first track delivers a signal to the device region. The first segment and the second segment are arranged in the same first track.

According to another embodiment of the present disclosure, a semiconductor device includes a substrate and a device region including active components carried by the substrate. One or more mixed-use tracks on the substrate include conductive lines connecting power and signals to the active components in the device region. A first mixed-use track includes a first segment selectively dedicated to delivering one of either power or a signal to the device region. A second segment in the same first mixed-use track, is selectively dedicated to deliver the other of either power or the signal to the device region.

According to another embodiment of the present disclosure, a semiconductor device includes a substrate and a first interconnect system on the substrate. A first device region is in the first interconnect system. A first track of conductive lines is in the first interconnect system. A first segment is in the first track configured to deliver power to the first device region. A second segment in the first track connects a first signal to the first device region. A second interconnect system is on the substrate. A second device region is in the second interconnect system. A second track of conductive lines is in the second interconnect system. A third segment in the second track is configured to deliver power to the second device region. A fourth segment in the second track connects a second signal to the second device region. A wire connect connects the second segment in the first track of the first interconnect system to the fourth segment in the second track of the second interconnect system, or to a terminal not present in the first interconnect system.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1:
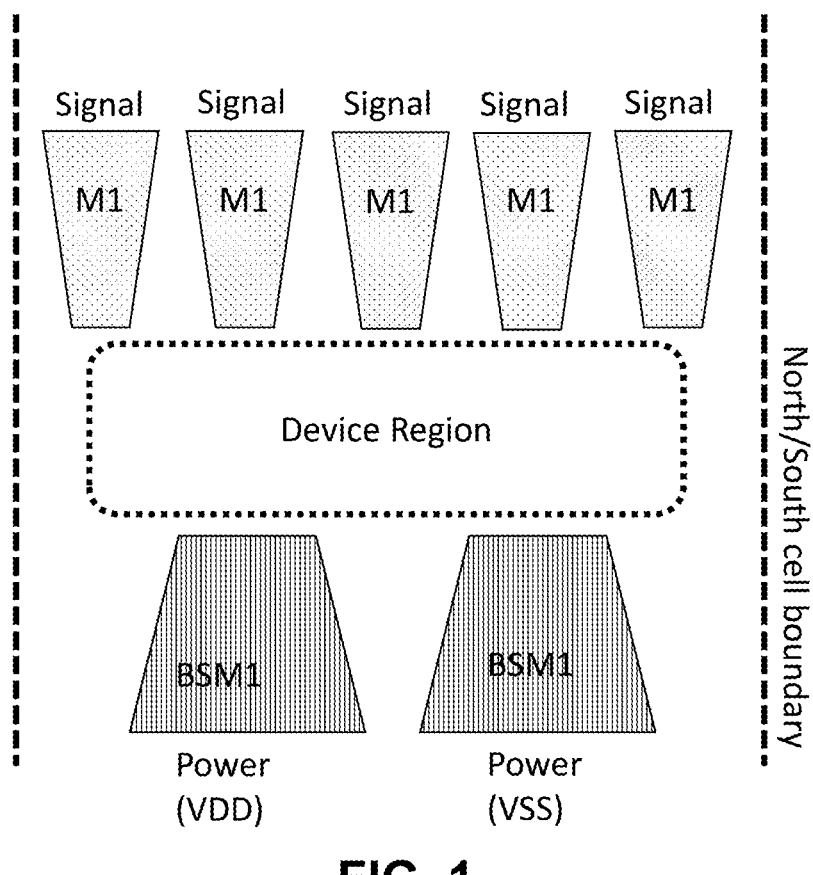
FIG. 1 is a schematic end view of a power delivery architecture in a conventional semiconductor device.

In general, the subject technology maximizes the use of a circuit layout area for either frontside delivery, backside delivery or a combination of both in semiconductor devices. A track assignment in a circuit layout may include segments of conductive lines that perform different types of delivery (power or signal) along the same shared track in a circuit layout. A track may include for example a conductive line of disconnected segments positioned in end-to-end alignment. One segment in the track may be configured to deliver power while simultaneously being positioned adjacent (but disconnected from) to another segment on the same line that delivers a signal. As will be appreciated, areas of a circuit that were typically dedicated solely to either power or signal may now provide one or the other or a mix of both so that the circuit footprint can maximize signal and power routing.

According to an embodiment of the present disclosure, a semiconductor device architecture is provided. The architecture includes a substrate and a device region including active components carried by the substrate. A plurality of tracks are on the substrate including conductive lines connecting power and one or more signals to the active components in the device region. A first track includes a plurality of segments of a conductive line. A first segment in the first track delivers power to the device region. A second segment in the first track delivers a signal of the one or more signals to the device region. The first segment and the second segment are arranged in the same first track.

According to one embodiment, which can be combined with one or more previous embodiments, the first segment is positioned on a frontside of the device region, and connected to a third segment on a backside of the device region. By using tracks with multiple types of signal or power delivery lines available, circuit designs have more flexibility in routing power signal from the frontside to the backside of the device region.

According to one embodiment, which can be combined with one or more previous embodiments, the third segment delivers power to the device region from the backside of the device region. The third segment is positioned on a second track that includes a fourth segment that connects the signal of the one or more signals to the device region. By including tracks with different delivery types on both side of the device region, more routing connections and signal paths become available.

According to one embodiment, which can be combined with one or more previous embodiments, the first segment is positioned on a frontside of the device region, and connected to a third segment on the frontside of the device region. The third segment delivers power to the device region. The third segment is positioned on a second track that includes a fourth segment that connects to the device region. The embodiment provides connecting similar delivery type lines on the same side of the device region using for example, jumpers to provide alternate power delivery paths. The track that includes the third segment and the fourth segment can now have power and signal delivery on the same track even when one segment is connected to another track.

According to one embodiment, which can be combined with one or more previous embodiments, the first segment includes a first width. The second segment includes a second width that is the same as the first width. By having segments with the same width, manufacturing complexity for the architecture is reduced.

According to one embodiment, which can be combined with one or more previous embodiments, the first segment and the second segment are disconnected. Disconnected segments on the same track allow for different delivery type segments without causing a short circuit.

According to one embodiment, which can be combined with one or more previous embodiments, the first segment and the second segment are positioned axially on the first track. By being axially positioned on the same track, the two segments can deliver different signal types to the device region while occupying the same footprint along the length of the layer.

According to one embodiment, which can be combined with one or more previous embodiments, the first segment includes a first width and the second segment includes a second width. The first width is not equal to the second width. With mixed type delivery lines being available on the same track, circuit layout may tailor some segments more efficiently for their intended function. For example, some power line segments may be made wider to handle sufficient power while adjacent signal line segments may be thinner to mitigate interference signals.

According to another embodiment of the present disclosure, a semiconductor device architecture includes a substrate and a device region including active components carried by the substrate. One or more mixed-use tracks on the substrate include conductive lines connecting power and signals to the active components in the device region. A first mixed-use track includes a first segment selectively dedicated to delivering one of either power or a signal of one or more signals to the device region. A second segment in the same first mixed-use track, is selectively dedicated to deliver the other of either power or the signal to the device region.

According to one embodiment, which can be combined with one or more previous embodiments, the first segment is positioned on a frontside of the device region, and connected to a third segment on a backside of the device region. By using tracks with multiple types of signal or power delivery lines available, circuit designs have more flexibility in routing power signal from the frontside to the backside of the device region.

According to one embodiment, which can be combined with one or more previous embodiments, the third segment delivers power to the device region from the backside of the device region. The third segment is positioned on a second mixed-use track that includes a fourth segment that connects the signal to the device region. One benefit provided by mixing delivery types includes decoupling the capacitance in parts of a circuit cell. For example, some circuits may include fill cells. An undesirable capacitance may be present between power delivery lines. By mixing delivery line types, the capacitance between adjacent power rails may be decoupled by jumping together two power delivery segments that are above and below the two rails. The power delivery segments may be on mixed-use lines that are shares with signal lines. Normally, the position of the jumped power delivery segments would be dedicated to signal delivery. However, the mixed-use tracks allow some segments in the normally signal only track to be power delivery which allows for bridging power lines and decouples the capacitance of the fill cell.

According to one embodiment, which can be combined with one or more previous embodiments, the first segment is positioned on a frontside of the device region, and connected to a third segment on the frontside of the device region. The third segment delivers power to the device region. The third segment is positioned on a second mixed-use track that includes a fourth segment that connects the signal of the one or more signals to the device region. The embodiment provides connecting similar delivery type lines on the same side of the device region using for example, jumpers to provide alternate power delivery paths. The track that includes the third segment and the fourth segment can now have power and signal delivery on the same track even when one segment is connected to another track.

According to one embodiment, which can be combined with one or more previous embodiments, the first segment includes a first width. The second segment includes a second width that is the same as the first width. By having segments with the same width, manufacturing complexity for the architecture is reduced.

According to one embodiment, which can be combined with one or more previous embodiments, the first segment and the second segment are disconnected. Disconnected segments on the same mixed-use track allow for different delivery type segments without causing a short circuit.

According to one embodiment, which can be combined with one or more previous embodiments, the first segment and the second segment are positioned axially on the same first mixed-use track. By being axially positioned on the same track, the two segments can deliver different signal types to the device region while occupying the same footprint along the length of the layer.

According to one embodiment, which can be combined with one or more previous embodiments, the first segment includes a first width. The second segment includes a second width that is the same as the first width. By having segments with the same width, manufacturing complexity for the architecture is reduced.

According to another embodiment of the present disclosure, a semiconductor device includes a substrate and a first interconnect system on the substrate. A first device region is in the first interconnect system. A first track of conductive lines is in the first interconnect system. A first segment is in the first track configured to deliver power to the first device region. A second segment in the first track connects a first signal to the first device region. A second interconnect system is in the substrate. A second device region is in the second interconnect system. A second track of conductive lines is in the second interconnect system. A third segment in the second track is configured to deliver power to the second device region. A fourth segment in the second track connects a second signal to the second device region. A wire connect connects the second segment in the first track of the first interconnect system to the fourth segment in the second track of the second interconnect system, or to a terminal not present in the first interconnect system.

According to one embodiment, which can be combined with one or more previous embodiments, the semiconductor device further includes a fifth segment in a third track of the first interconnect system. The fifth segment is configured to deliver power to the first device region. A fill cell is in the first interconnect system. The fifth segment is connected to the first segment in the first track. As will be appreciated, the disconnected segments increase decoupling capacitance in the fill cells between active logic cells of the interconnect system.

According to one embodiment, which can be combined with one or more previous embodiments, the first segment and the second segment are disconnected from each other in the first track of conductive lines. The third segment and the fourth segment are disconnected from each other in the second track of conductive lines. Disconnected segments on the same mixed-use track allow for different delivery type segments without causing a short circuit.

According to one embodiment, which can be combined with one or more previous embodiments, the first segment and the second segment are positioned axially on the first track of conductive lines. The third segment and the fourth segment are positioned axially on the second track of conductive lines. By being axially positioned on the same track, the two segments can deliver different signal types to the device region while occupying the same footprint along the length of the layer.

Referring to FIG. 1, in a conventional power/signal delivery architecture is shown for semiconductor devices. A single processing cell is shown and it will be understood that a device may include multiple cells adjacent the cell shown. The view shown represents conductive lines that extend into the paper. As shown, some conventional device architectures position all signal lines on the frontside of a device region and all place power lines on the backside of the device region. Whether positioned on the frontside or backside of a device region, conventional architectures limit the use of a track to a single type of carrier; power or signal.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. Similarly, an element described as "on top of" of another element may mean either that the element is positioned above and is not necessarily in direct contact with the underlying element. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. The phrase "electrically connected" does not necessarily mean that the elements must be directly in physical contact together-intervening elements may be provided between the "connected" or "electrically connected" elements.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Definitions

Line: Metallization used to conduct power or a signal.

Track: A linear section on a substrate designated for occupancy by line (whether whole or segmented).

Segment: A part of a line in a track that is adjacent one or more other segments on the same track. Segments may be axial to each other when sharing a track.

Track assignment: A designation of function assigned to a track as a whole or to individual segments within a track.

Power Line or Power Rail: A conductive line designated or used to carry power to operate one or more components.

Signal Line: A conductive line designated or used to carry information.

Device Region: An area of the semiconductor device that includes active components for processing signals and computation. The device region may include an integrated circuit of active components or individual active components carried by the substrate.

Substrate: Reference to a substrate may refer to material that provides a support structure to features in or on top of the substrate material. As used below, there may be more than one substrate present in an embodiment shown. Also, since embodiments below are generally shown in cross-section, it should be understood that a substrate for a layer with patterned features may not be visible in the view so as to highlight the features for the layer.

Cell: A section of an integrated circuit that includes a sub-circuit. Multiple cells may be present in the same sub-circuit. Cells may be positioned adjacent one another and interconnected into an overall circuit.

Example Device Architecture

Figure 2:
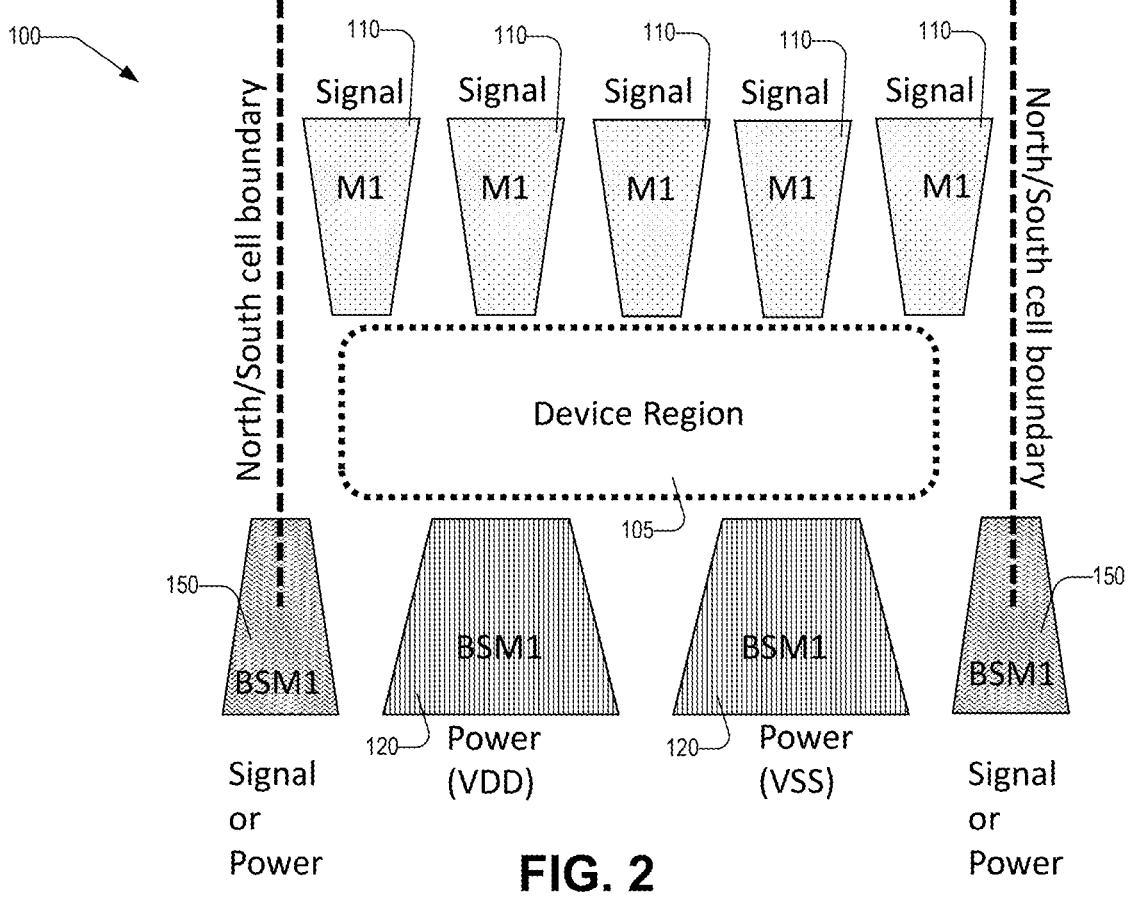
FIG. 2 is a schematic end view of a power delivery architecture, consistent with embodiments of the present disclosure.

Referring now to FIG. 2, the subject disclosure provides a semiconductor device power delivery architecture 100 (sometimes referred to herein as the "architecture 100") that maximizes the usable area of a circuit cell layout. The architecture 100 includes track assignments that include conductive lines with different delivery functions. For example, a single track may include segments of conductive lines. One segment in the track may be designated for power delivery. Another segment on the same track may be designated for signal delivery. It should be understood that power delivery segments and signal delivery segments do not physically touch or are not electrically connected. Embodiments of the architecture 100 generally include a device region 105. Elements above the device region 105 represent frontside features, which may be on one or more substrate layers planar to the device region 105. Elements below the device region 105 represent backside features, which may also be on one or more substrate layers. In one illustrative example, the architecture 105 includes a plurality of signal lines 110 on the frontside of the device. Two power delivery lines 120 (one for VSS and the other for VDD) are on the backside of the device. The architecture 100 also includes one or more mixed-use lines 150 that have at least one conductive portion for power delivery and one conductive portion for signal delivery. The mixed-use lines 150 may be positioned on the frontside of device region 105, the backside of device region 105, or on both side of the device region 105.

Figure 3:
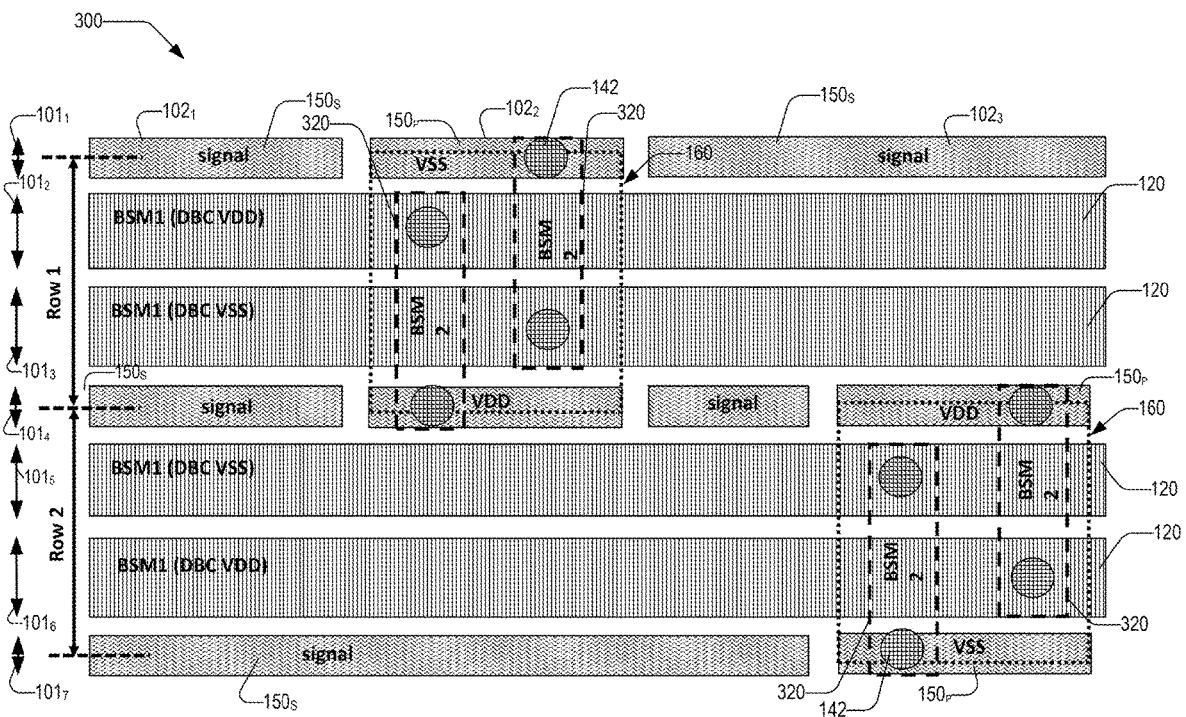
FIG. 3 is a top view of the power delivery architecture of FIG. 2, consistent with embodiments of the present disclosure.

FIG. 3 shows a top plan view of an interconnect system 300 that uses an example of the architecture 100 of FIG. 2. In the interconnect system 300 (and in figures further below), the label "BSM1" refers to a backside metal 1. "BSM2" refers to a backside metal 2. The interconnect system 300 may include a plurality of rows of circuits. A single row may have a row of PFET active region and a row of NFET active region, spanning some arbitrary length (along the x-axis in the top-down images). Within that row there may be several cells which are wired together as part of a circuit, or as different parts of different circuits which have cell placements along the same row. Some of the power delivery lines 120 use a direct backside contact (DBC). For example, a backside metallization layer connects to the backside of a device layer through a via which lands directly over the backside of that device layer. A buried via 142 may connect the first backside metal layer to the second backside metal layer.

The interconnect system 300 includes a plurality of tracks generally designated as tracks 101 that are distinguished by subscripts indicating their track number. Track 1 is labeled as $101_1$. Track 2 is labeled as $101_2$. And so on until to track 7. While not shown, it should be understood that the tracks 101 are laid on a substrate which may include multiple layers. At least one of the layers includes a device region. The interconnect system 300 may be located on a layer of the substrate that is either on the frontside or backside of the device region, however the view shown is from the backside. Each track 101 includes one or more conductive segments of conductive lines, generally designated as 102. The conductive lines carry power and signals to active components in the device region. Some tracks 101 are dedicated to a single delivery function. For example, tracks 101$_2$, 101$_3$, 101$_5$, and 101$_6$ each include only power delivery lines 120. Tracks 101 dedicated to a single function may not necessarily be segmented.

Some tracks 101 may be designated for mixed-use delivery. The conductive line in a mixed-use track may be broken up into disconnected segments 102 (for example, are arranged in a high-ohmic relationship). For example, tracks 101$_1$, 101$_3$, and 101$_7$ are mixed-use tracks that include at least one power delivery segment 150$_P$ and one signal delivery segment 150$_S$. Track 101$_1$ for example, includes a segment 102$_1$ that is a signal delivery segment 150$_S$ followed by a segment 102$_2$ that is a power delivery segment 150$_P$, followed by segment 102$_3$ that is another signal delivery segment 150$_S$. The segments 102 on the same mixed-use track 101 may be positioned end to end, spaced from one another, and positioned axially to one another. In some embodiments, the segments 102 on the same mixed-use track 101 may have line widths that are the same as each other. In some embodiments, the segments 102 on the same mixed-use track 101 may have line widths that are different from each other. For example, a first segment 102$_1$ may have a first width that is greater than or less than (or may not generally be equal to) a second width of a second segment 102$_2$.

In some embodiments, a segment 102$_2$ used to carry power in one interconnect system 300 may have a similarly positioned segment 102$_2$ in another interconnect system 300 but is used in the other interconnect system 300 to carry a signal. The function for a segment 102 in any given interconnect system 300 may depend on how the segment 102 is connected to other conductive lines in the interconnect system. For example, two interconnect system 300 in a semiconductor device may have the same circuit line layout. The two different interconnect systems 300 may be connected to each other or disconnected from each other. A first segment in a mixed-use track 101 of a first interconnect system 300 may be selectively dedicated to delivering one of either power or a signal to the device region. The second segment in the same mixed-use track 101 in the first interconnect system 300 may be selectively dedicated to delivering the other function, either power or signal, that is not delivered by the first segment 102. For example, the first segment 102$_2$ delivers power and the second segment 102$_3$ delivers the signal. In a second interconnect system 300 with the same circuit layout, the first segment 102$_2$ and the second segment 102$_3$ may switch delivery functions so that the first segment 102$_2$ delivers the signal and the second segment 102$_3$ delivers the power. As may be appreciated, the subject technology provides flexible use of the segments 102 to provide a wide range of different circuit topologies using the same base layout of segments 102.

As will be appreciated, the mixed-use tracks 101 provide flexibility in designing the layout of interconnect system 300. Since tracks 101 may include different types of delivery lines, more combinations of circuit layouts become possible. As can be seen, power can be delivered to areas that are between signal lines. For example, a jumper 320 may couple segment 102$_2$ (a VSS line) on track 101$_1$ using buried vias 142 to the power delivery line 120 (also a VSS line) on track 101$_3$. Similarly, a jumper 320 may couple the power delivery line 120 (a VDD line) on track 101$_2$ to the VDD segment (unnumbered) on track 101$_4$. The jumper connections may create fill cells 160. Another fill cell 160 is shown in the lower right section of the interconnect system 300. The disconnected segment 102 in the tracks 101 increase decoupling capacitance in fill cells 160 between active logic cells. The decoupling capacitance adds a capacitive load to the interconnect system 300, which suppresses power noise.

Figure 4:
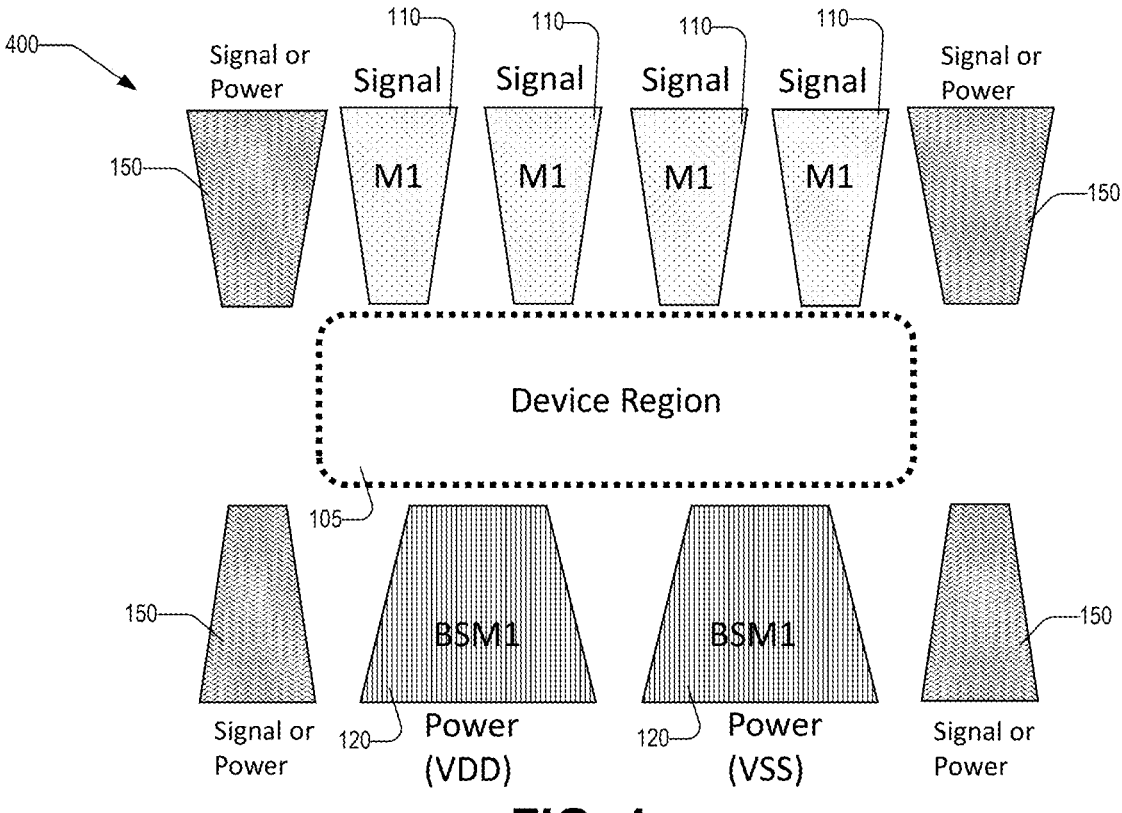
FIG. 4 is a schematic end view of a power delivery architecture according to another embodiment.

FIG. 4 shows an architecture 400 that is similar to the architecture 100 but includes a difference in that mixed-use lines 150 are positioned on both the frontside of the device region 105 and on the backside of the device region 105. By including mixed-use lines 150 on both the frontside and backside of the device region 105, additional layout combinations are possible. For example, power delivery between the frontside and backside becomes possible using tracks that were formerly dedicated to only signal delivery. Jumpers may be positioned in different locations of track segments (as compared to fixed locations that connected power delivery lines together).

Figure 5:
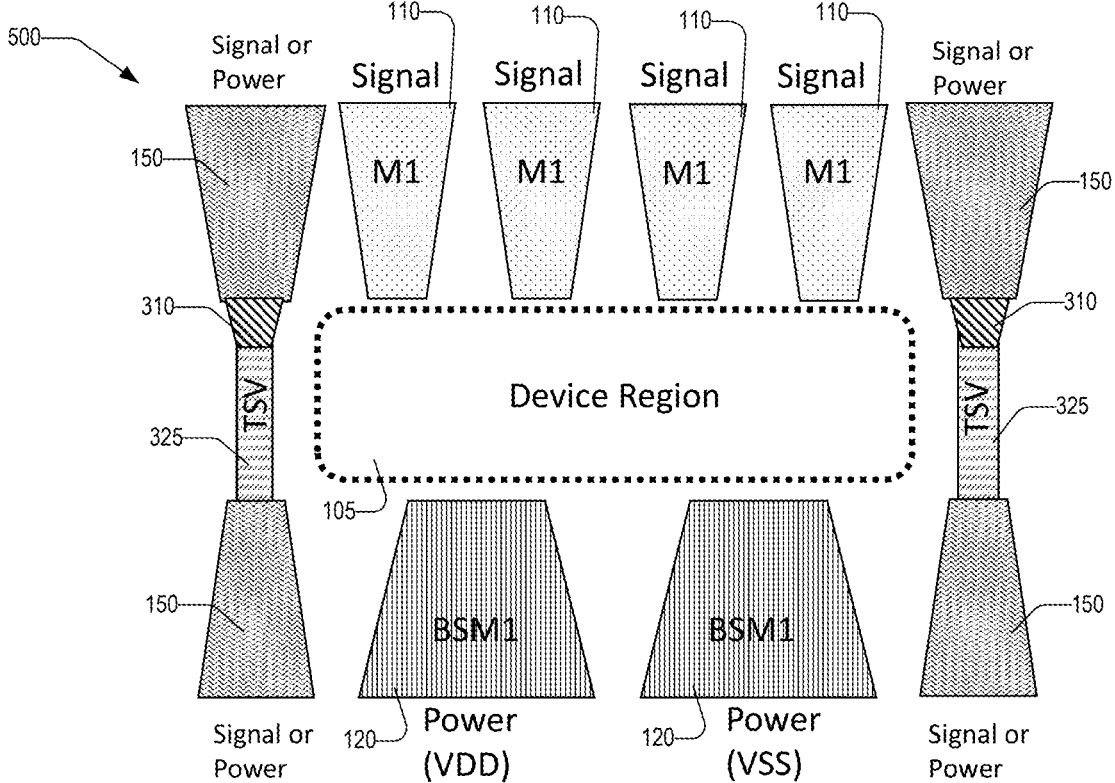
FIG. 5 is a schematic end view of a power delivery architecture according to another embodiment.

FIG. 5 shows an architecture 500 that is similar to the architecture 400 but adds a jumper (for example, using a first frontside level via 310 connected to through-silicon via 325) connecting mixed-use lines 150 from the frontside to the backside of the device region 105. The first frontside level via 310 may sometimes be used to connect the source and drain contact metal or the gate contact metal to the first frontside metal level. It should be understood that the segment from one mixed-use line 150 will be of the same type of delivery as the segment on the connecting mixed-use line 150 (for example, power delivery segment to power delivery segment or signal delivery segment to signal delivery segment). Jumping together mixed-use lines 150 on opposing sides of the device region 105 opens up even more combinations of circuit layouts possible. Signals may be routed vertically in a local area of the device, bypassing the edges of the device region 105 while power may be delivered to the device region 105 from the same track as either signal delivery segment that is jumped. Likewise, power delivery may be re-routed through the layers of the substrate while signal line segments may occupy the same tracks thus increasing signal routing capacity in the same space of a circuit.

Figure 6:
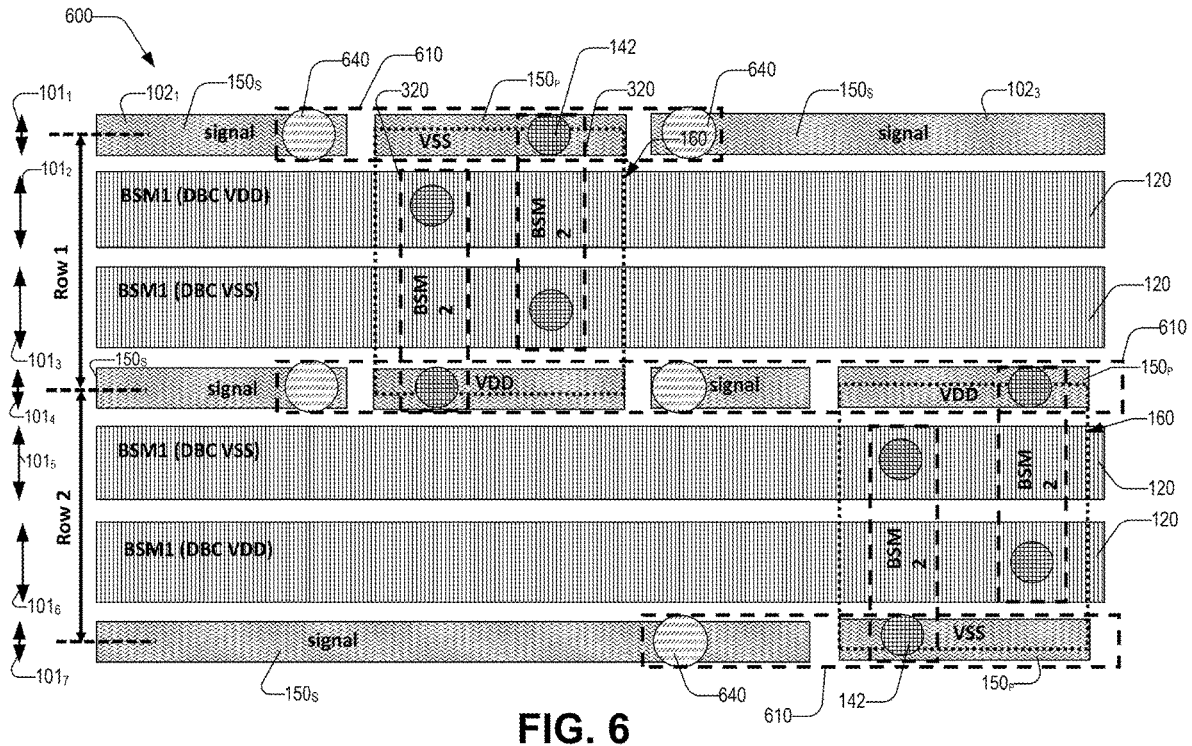
FIG. 6 is a top view of the power delivery architecture of FIG. 5, consistent with embodiments of the present disclosure.

FIG. 6 shows a top plan view of an interconnect system 600 that uses the architecture 500 of FIG. 5. The interconnect system 600 is similar to the interconnect system 300 of FIG. 3 except that mixed-use tracks are present on both the frontside and backside of the device region. The inclusion of mixed-use tracks both on the frontside and backside north/ south boundaries provides an opportunity to wire over fill cells 160 using wire connections 610 which would normally have power rail segments obstructing the connection. For example, in some embodiments, track 101$_1$ may include a wire connection 610 that bridges segment 102$_1$ (a signal delivery line) to segment 102$_3$ (a signal delivery line) (using through through-silicon vias 640) that bypasses segment 102$_2$ (a power delivery line) that is on the same track. A similar wire connection 610 is shown on track 101$_4$. On track 101$_7$, a wire connection 610 routes the signal delivery segment 150$_S$ over the underlying power delivery segment 150$_P$ to the right. In this figure, the wire connection 610 does not terminate anywhere within view; for example, the wire connection 610 on track 101$_7$ extends toward some terminal beyond the figure that is not present in the first interconnect system. In some embodiments, the terminal out of view may be a signal delivery segment 150$_S$ on a second interconnect system (300, 600, or 1200).

Figure 7:
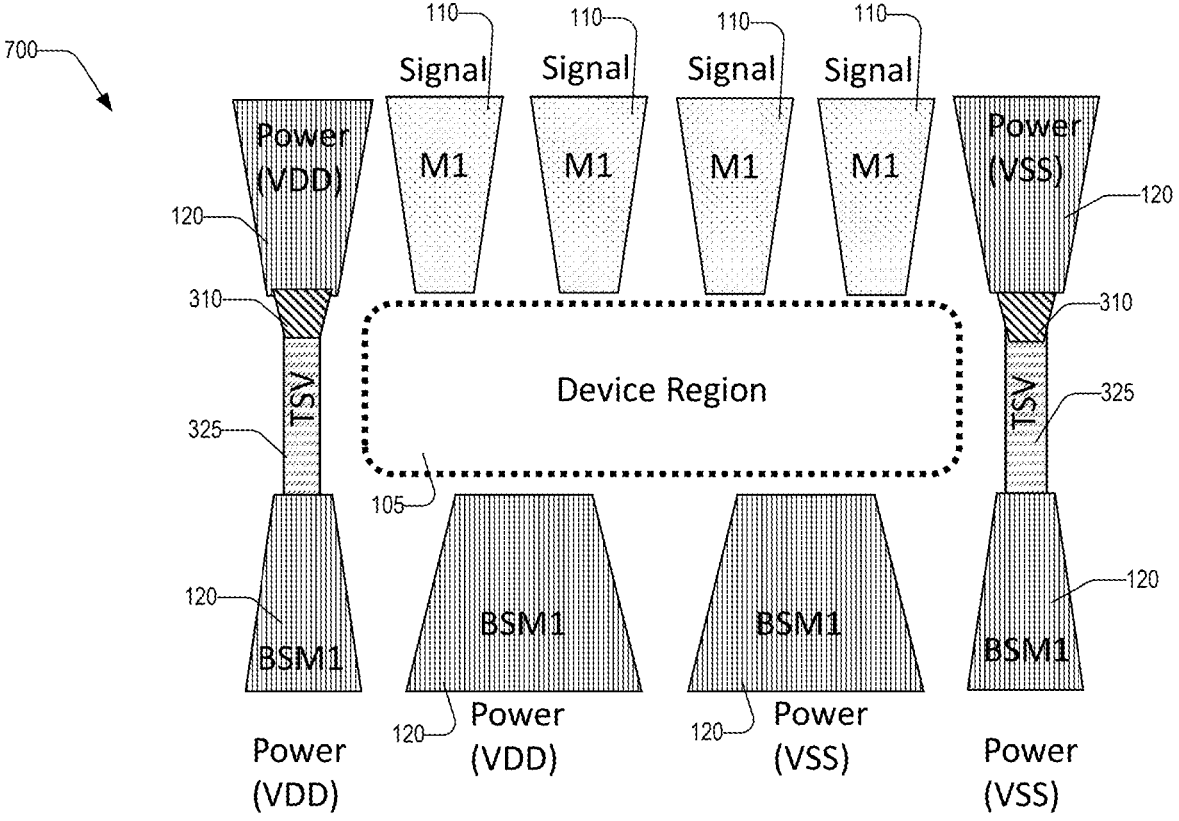
FIG. 7 is a schematic end view of a power delivery architecture according to another embodiment.
Figure 8:
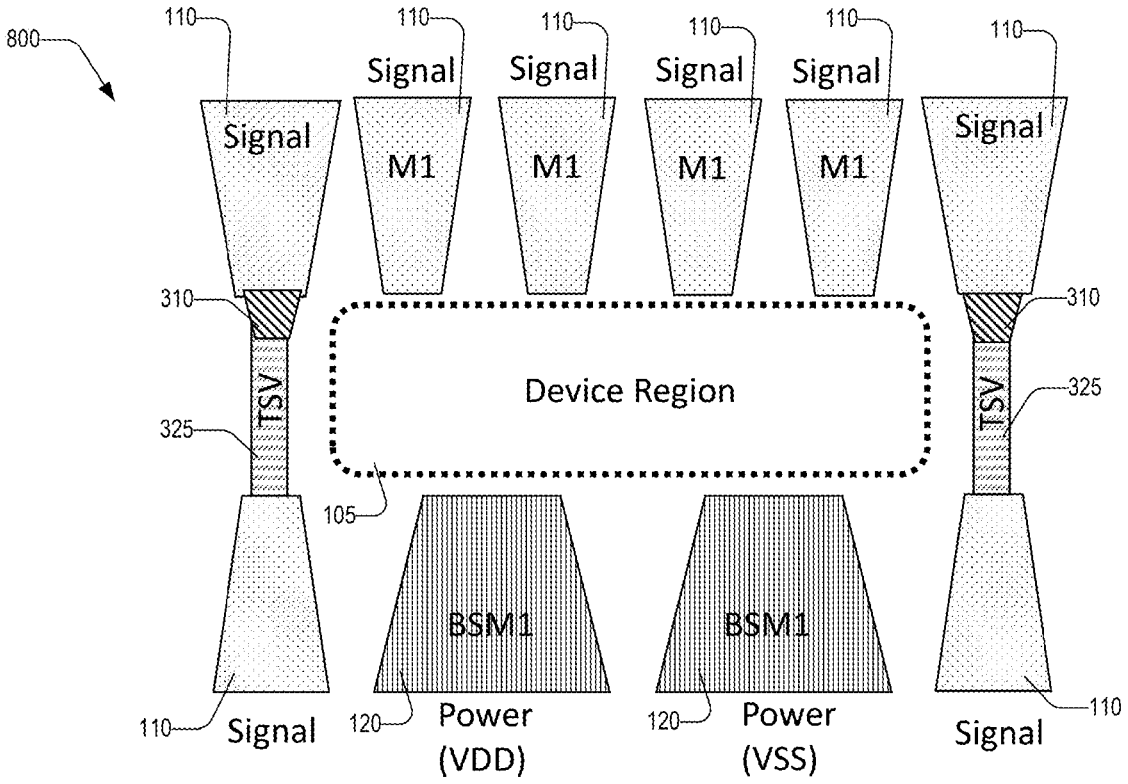
FIG. 8 is a schematic end view of a power delivery architecture according to another embodiment.
Figure 9:
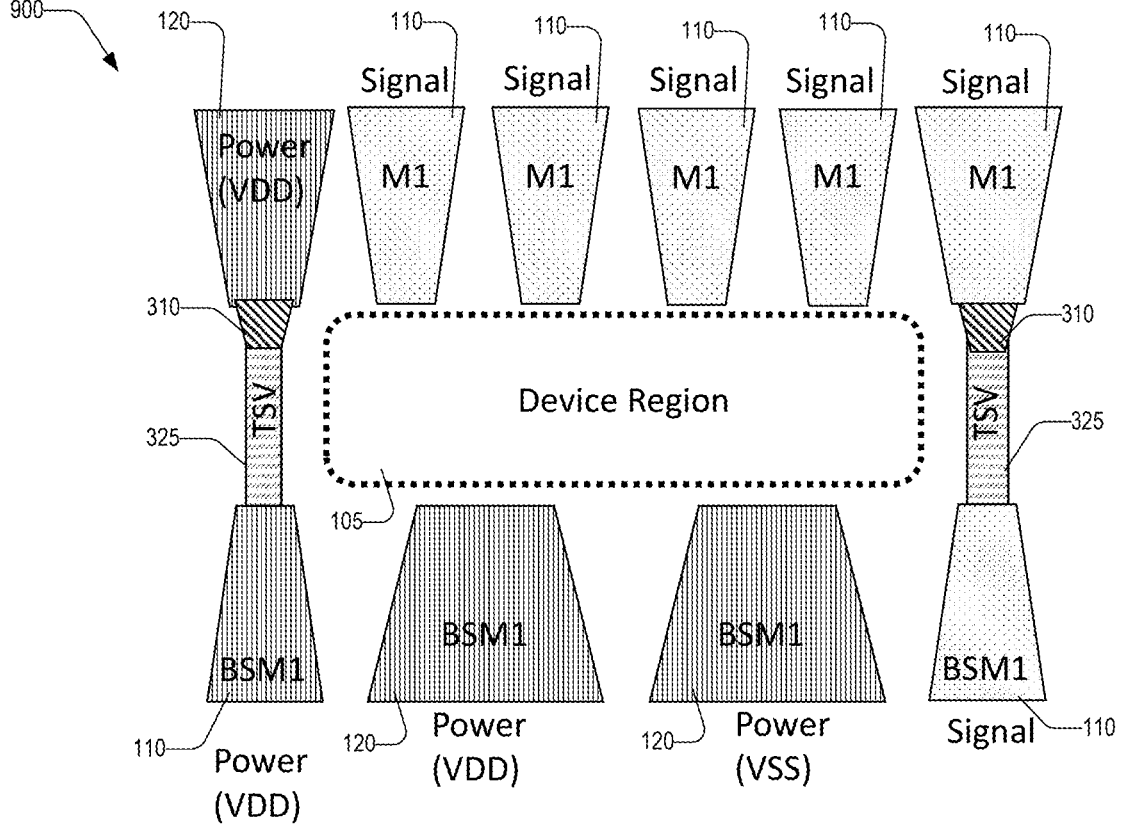
FIG. 9 is a schematic end view of a power delivery architecture according to another embodiment.

FIGS. 7, 8, and 9 show variations of architectures similar to the architecture 500. FIG. 7 shows an architecture 700 that is similar to the embodiments described in FIGS. 5 and 6 except that power delivery lines 120 from the frontside are jumped to the backside of the device. The embodiment shown in FIGS. 7-9 may be used in conjunction with the architectures shown in FIGS. 1-6. For example, the architectures 700, 800, and 900 may be located in layers of the semiconductor device that couple to other layers that may have one or more embodiments shown in FIGS. 1-6. FIG. 8 shows an embodiment that jumps signal delivery lines 110 from the frontside to the backside of the device. FIG. 9 shows an embodiment that jumps a power delivery line 120 on the frontside to a power delivery line 120 on the backside and jumps a signal delivery line 110 on the frontside to a signal delivery line on the backside.

Figure 10:
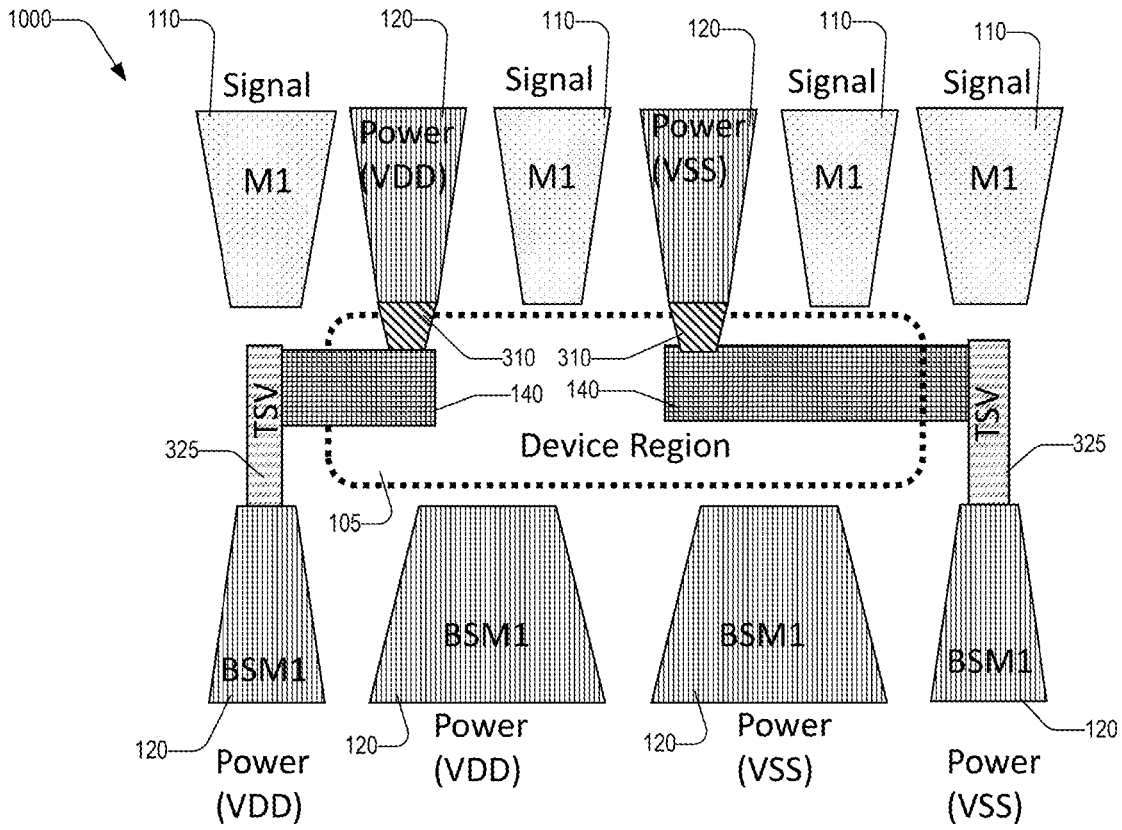
FIG. 10 is a schematic end view of a power delivery architecture according to another embodiment.

FIG. 10 shows an architecture 1000 that connects power delivery lines 120 from the frontside to the backside using metal middle end of line layer 140 (which may be a local interconnect having variable width) and through-silicon vias 325 that may pass through the device region 105. The architecture 1000 FIG. 10 may be used in conjunction with any of the embodiments described earlier in FIGS. 1-6.

Figure 11:
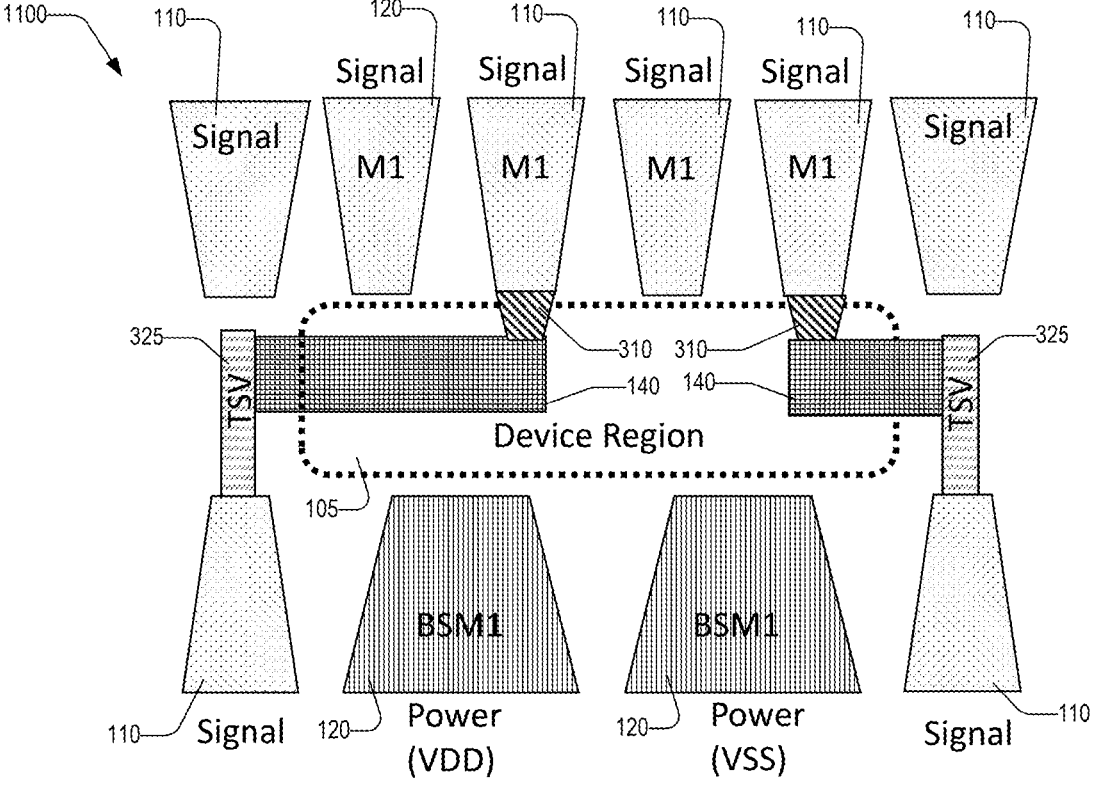
FIG. 11 is a top view of the power delivery architecture of FIG. 10, consistent with embodiments of the present disclosure.

FIG. 11 shows an architecture 1100 that connects signal lines 110 from the frontside of the device region 105 to another signal line 110 on the backside using a via 310 and metal middle end of line layer 140 combination. The architecture 1100 may be used in conjunction with any of the embodiments shown in FIGS. 1-6.

Figure 12:
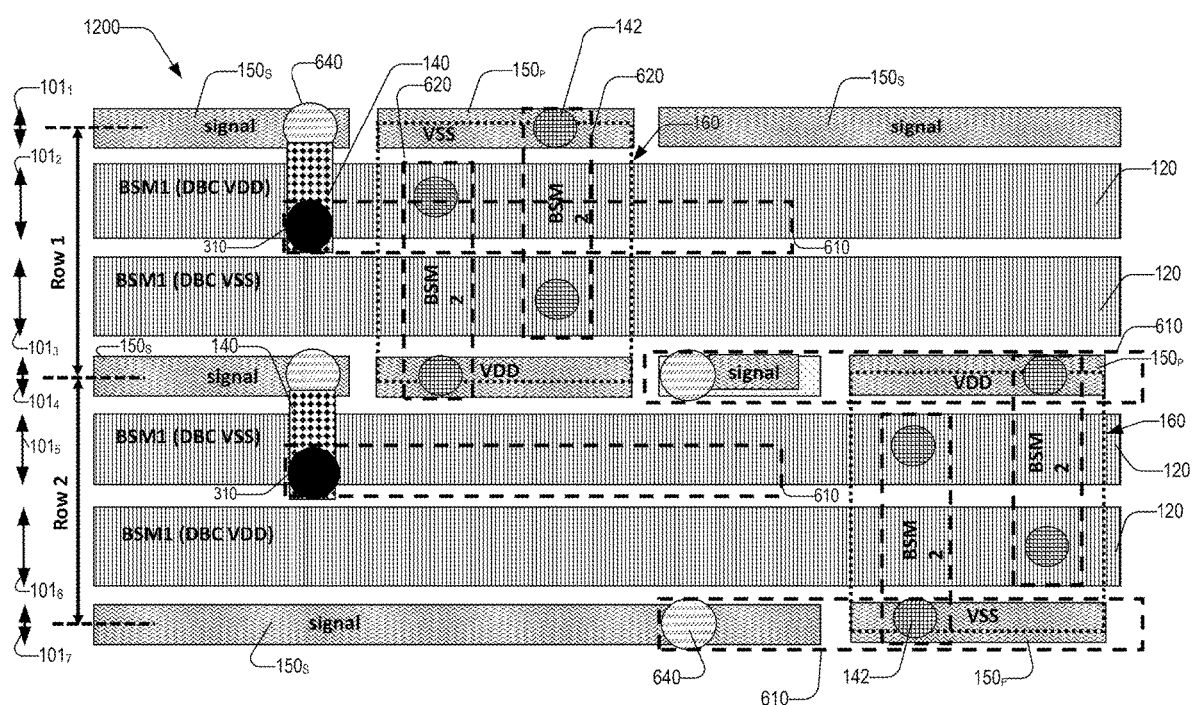
FIG. 12 is a schematic end view of a power delivery architecture according to another embodiment.

FIG. 12 shows an interconnect system 1200 as an example of the architecture 1100 of FIG. 11. The interconnect system 1200 shows an example of how vias 640 and middle end of line layers 140 may connect a signal line segment 150$_S$ on the frontside side of the device region to a signal line segment 150$_S$ on the other side of the device region.

Figure 13:
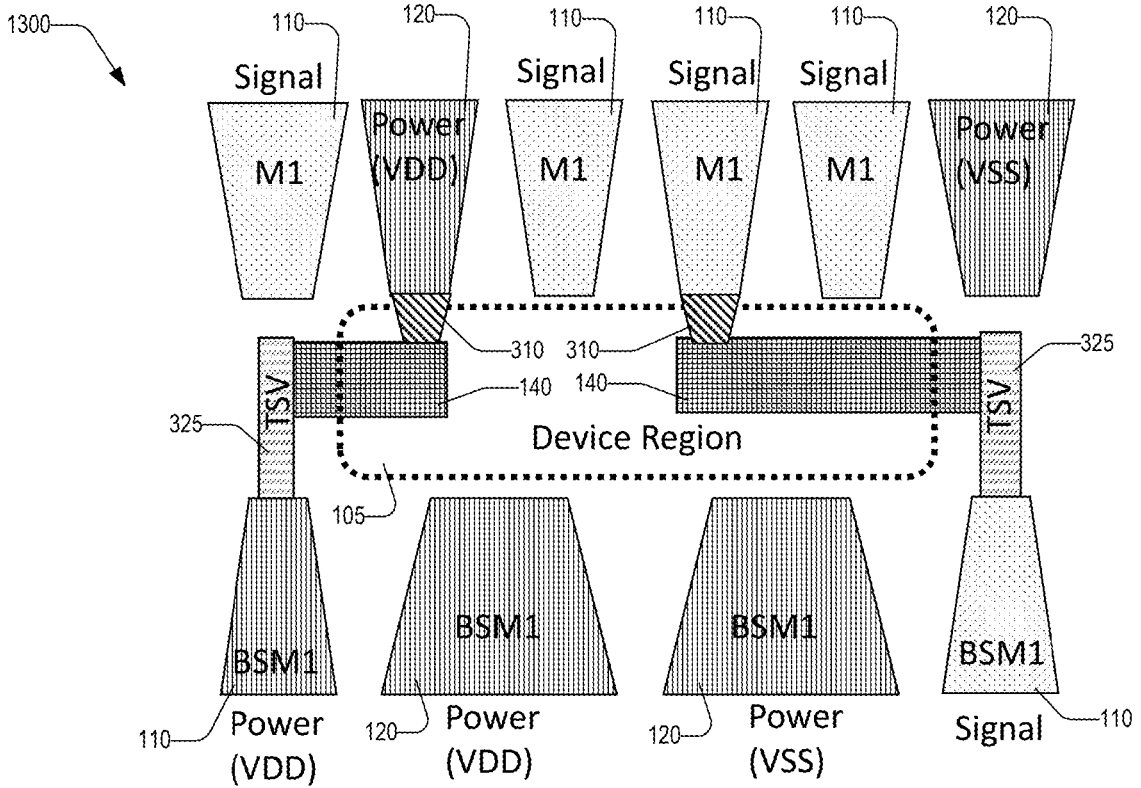
FIG. 13 is a schematic end view of a power delivery architecture according to another embodiment.

FIG. 13 shows an architecture 1300 that is similar to the architectures 1000 and 1100, consistent with an illustrative embodiment. In the architecture 1300, the via 310, middle end of line layer 140 and through-silicon via 325 combination bridge a signal delivery line 110 on the frontside to a signal delivery line 110 on the backside. Simultaneously, another via 310, middle end of line layer 140 and through-silicon via 325 combination may bridge a power delivery line 120 on the frontside to a power delivery line 120 on the backside. In FIGS. 10-13, any of the signal delivery lines 110 and power delivery lines 120 may be part of a mixed-use track.

The fabrication of the devices described herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the interconnect systems 300, 600 and 1200 can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

In one embodiment, the base substrate in which the interconnect systems 300, 600 and 1200 are formed may be a bulk semiconductor substrate formed of, for example, silicon, or other types of semiconductor substrate materials that are commonly used in bulk semiconductor fabrication such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A semiconductor device architecture, comprising:
a substrate;
a device region including active components carried by the substrate; and
a plurality of tracks on the substrate, the plurality of tracks comprising conductive lines connecting power and one or more signals to the active components in the device region, wherein a first track includes:
a plurality of segments of a conductive line;
a first segment in the first track configured to deliver power to the device region; and
a second segment in the first track configured to deliver a signal of the one or more signals to the device region;
wherein the first segment and the second segment are arranged in the first track,
wherein the first segment is positioned on a frontside of the device region, and connected to a third segment on a backside of the device region.

2. The semiconductor device architecture of claim 1, wherein:
the third segment delivers power to the device region from the backside of the device region; and
the third segment is positioned on a second track that includes a fourth segment that connects the signal to the device region.

3. The semiconductor device architecture of claim 1, wherein:
the first segment is positioned on a frontside of the device region, and connected to a third segment on the frontside of the device region;
the third segment delivers power to the device region; and
the third segment is positioned on a second track that includes a fourth segment that connects the signal of the one or more signals to the device region.

4. The semiconductor device architecture of claim 1, wherein:
the first segment includes a first width; and
the second segment includes a second width that is equal to the first width.

5. The semiconductor device architecture of claim 1, wherein the first segment and the second segment are disconnected.

6. The semiconductor device architecture of claim 1, wherein the first segment and the second segment are positioned axially on the first track.

7. The semiconductor device architecture of claim 1, wherein the first segment includes a first width and the second segment includes a second width, wherein the first width is not equal to the second width.

8. A semiconductor device architecture, comprising:
a substrate;
a device region including active components carried by the substrate; and
one or more mixed-use tracks on the substrate, the one or more mixed-use tracks comprising respective conductive lines connecting power and one or more signals to the active components in the device region, wherein a first mixed-use track includes:
a first segment selectively dedicated to delivering one of either power or a signal of the one or more signals to the device region; and
a second segment in the first mixed-use track, selectively dedicated to deliver the other of either the power or the signal of the one or more signals to the device region,
wherein the first segment includes a first width and the second segment includes a second width that is equal to the first width.

9. The semiconductor device architecture of claim 8, wherein the first segment is positioned on a frontside of the device region, and connected to a third segment on a backside of the device region.

10. The semiconductor device architecture of claim 9, wherein:
the third segment delivers power to the device region from the backside of the device region; and
the third segment is positioned on a second mixed-use track that includes a fourth segment that connects the signal of the one or more signals to the device region.

11. The semiconductor device architecture of claim 8, wherein:
the first segment is positioned on a frontside of the device region, and connected to a third segment on the frontside of the device region;
the third segment delivers power to the device region; and the third segment is positioned on a second mixed-use track that includes a fourth segment that connects the signal of the one or more signals to the device region.

12. The semiconductor device architecture of claim 8, wherein the first segment and the second segment are disconnected.

13. The semiconductor device architecture of claim 8, wherein the first segment and the second segment are positioned axially on the same first mixed-use track.

14. The semiconductor device architecture of claim 8, wherein:

the first segment includes a first width;

the second segment includes a second width; and the first width is not equal to the second width.

15. A semiconductor device, comprising:

a substrate;

a first interconnect system on the substrate;

a first device region in the first interconnect system;

a first track of conductive lines in the first interconnect system;

a first segment in the first track configured to deliver power to the first device region;

a second segment in the first track that connects a first signal to the first device region;

a second interconnect system on the substrate;

a second device region in the second interconnect system;

a second track of conductive lines in the second interconnect system;

a third segment in the second track configured to deliver power to the second device region;

a fourth segment in the second track that connects a second signal to the second device region; and a wire connect connecting the second segment in the first track of the first interconnect system to the fourth segment in the second track of conductive lines in the second interconnect system, or to a terminal not present in the first interconnect system.

16. The semiconductor device of claim 15, further comprising:

a fifth segment in a third track of the first interconnect system, wherein the fifth segment is configured to deliver power to the first device region; and a fill cell in the first interconnect system, wherein the fifth segment is connected to the first segment in the first track.

17. The semiconductor device of claim 15, wherein:

the first segment and the second segment are disconnected from each other in the first track of conductive lines; and the third segment and the fourth segment are disconnected from each other in the second track of conductive lines.

18. The semiconductor device of claim 15, wherein:

the first segment and the second segment are positioned axially on the first track of conductive lines; and the third segment and the fourth segment are positioned axially on the second track of conductive lines.

* * * * *